United States Patent
Kukita et al.

(10) Patent No.: US 12,258,491 B2
(45) Date of Patent: Mar. 25, 2025

(54) POLISHING LIQUID, POLISHING LIQUID SET, AND POLISHING METHOD

(71) Applicant: Showa Denko Materials Co., Ltd., Tokyo (JP)

(72) Inventors: Tomomi Kukita, Tokyo (JP); Tomohiro Iwano, Tokyo (JP); Tomoyasu Hasegawa, Tokyo (JP)

(73) Assignee: Resonac Corporation, Tokyo (JP)

( * ) Notice: Subject to any disclaimer, the term of this patent is extended or adjusted under 35 U.S.C. 154(b) by 212 days.

(21) Appl. No.: 17/771,919

(22) PCT Filed: Jan. 6, 2021

(86) PCT No.: PCT/JP2021/000245
§ 371 (c)(1),
(2) Date: Apr. 26, 2022

(87) PCT Pub. No.: WO2022/149224
PCT Pub. Date: Jul. 14, 2022

(65) Prior Publication Data
US 2023/0203342 A1  Jun. 29, 2023

(51) Int. Cl.
*C09G 1/02* (2006.01)

(52) U.S. Cl.
CPC ..................... *C09G 1/02* (2013.01)

(58) Field of Classification Search
None
See application file for complete search history.

(56) References Cited

U.S. PATENT DOCUMENTS

| | | | | |
|---|---|---|---|---|
| 2008/0045018 A1* | 2/2008 | Yoon | ........................ | C09G 1/02 257/E21.244 |
| 2010/0009538 A1* | 1/2010 | Kamimura | ........... | C09K 3/1409 438/692 |
| 2011/0053462 A1 | 3/2011 | Shida et al. | | |
| 2011/0124195 A1* | 5/2011 | Park | ........................ | C09G 1/02 438/693 |
| 2015/0232704 A1* | 8/2015 | Akutsu | ............. | H01L 21/76224 252/79.1 |
| 2019/0292406 A1* | 9/2019 | Cho | ........................ | C09G 1/04 |
| 2020/0299544 A1* | 9/2020 | Hanano | ............. | H01L 21/31053 |
| 2021/0179891 A1* | 6/2021 | Park | ..................... | H01L 21/3212 |
| 2021/0324236 A1* | 10/2021 | Guo | ................... | H01L 21/76819 |
| 2023/0331930 A1* | 10/2023 | Tansho | .................... | C08L 29/04 |

FOREIGN PATENT DOCUMENTS

| | | |
|---|---|---|
| CN | 102131885 A | 7/2011 |
| CN | 104582899 A | 4/2015 |
| EP | 1369906 A1 | 12/2003 |
| EP | 2952550 A1 | 12/2015 |
| JP | 2011-529269 A | 12/2011 |
| KR | 1020020086953 A | 11/2002 |
| KR | 1020100011030 A | 2/2010 |
| WO | 2019/181016 A1 | 9/2019 |
| WO | 2019/182063 A1 | 9/2019 |
| WO | 2020/021730 A1 | 1/2020 |
| WO | 2020/245994 A1 | 12/2020 |

OTHER PUBLICATIONS

"Kao's Surfactants", Kao Corporation [Online],URL:https://chemical.kao.com/jpja/pdf/catalog/surfactants_1907. pdf, Jul. 2019, p. 9 (cited in ISR).

"Poly(oxyethylene)=alkylether-Ministry of Environment", Ministry of Environment [Online], Internet : URL:https://www.env.go.jp/chemi/report/h22-01/pdf/chpt1/1-2-3-07.pdf, 2010. 03, p. 1 (cited in ISR).

* cited by examiner

Primary Examiner — Allan W. Olsen
(74) Attorney, Agent, or Firm — Fitch, Even, Tabin & Flannery LLP

(57) ABSTRACT

A polishing liquid containing: abrasive grains; at least one hydroxy acid component selected from the group consisting of a hydroxy acid and a salt thereof; and a compound Z, in which the compound Z has a hydrocarbon group which may be substituted and a polyoxyalkylene group, and a Z value represented by General Formula (1) below is 20 or more:

$$Z=0.1 \times a^2 \times b/c \qquad (1)$$

[in Formula (1), "a" represents the number of carbon atoms of the hydrocarbon group, "b" represents the total number of oxyalkylene groups in the compound Z, and "c" represents an HLB value of the compound Z.]

21 Claims, No Drawings

POLISHING LIQUID, POLISHING LIQUID SET, AND POLISHING METHOD

CROSS-REFERENCE TO RELATED APPLICATIONS

This application is a U.S. national phase application filed under 35 U.S.C. § 371 of International Application No PCT/JP2021/000245, filed Jan. 6, 2021, which is incorporated herein by reference in its entirety.

TECHNICAL FIELD

The present disclosure relates to a polishing liquid, a polishing liquid set, a polishing method, and the like.

BACKGROUND ART

In recent years, processing techniques for increasing density are becoming ever more important in manufacturing steps for semiconductor elements. CMP (chemical mechanical polishing) technique that is one of processing techniques has become an essential technique in manufacturing steps for semiconductor elements, for a shallow trench isolation (hereinafter, referred to as "STI") formation, flattening of pre-metal insulating materials or interlayer insulating materials, formation of plugs or embedded metal wirings, or the like.

With an increase in density of semiconductor elements, a technique of forming fine patterns is used so as to achieve higher integration. Thereby, standards required in the manufacturing steps for semiconductor elements become severe, and it is necessary to make a base substrate having a plurality of insulating materials highly flat. Particularly, in the CMP technique for formation of STI (for example, lower STI of semiconductor elements), a laminate, which has a substrate having a concavo-convex pattern, a stopper (a polishing stop layer containing a stopper material) disposed on the convex portion of the substrate, and an insulating material (for example, silicon oxide) disposed on the substrate and the stopper to fill the concave portion of the substrate, may be polished in some cases. In such polishing, polishing of an insulating material is stopped by a stopper, and polishing of the insulating material is stopped at the stage in which the stopper is exposed. The reason for this is that the polished amount of the insulating material (for example, the film thickness of the insulating material removed in an insulating film) is difficult to artificially control, and thus the insulating material is polished until the stopper is exposed, thereby controlling the degree of polishing.

In the CMP technique, in order to avoid an insulating material from remaining on a stopper after polishing is stopped at the stage where the insulating material is polished to allow the stopper to be exposed, polishing is excessively performed even after the stopper is exposed in some cases. This excessive polishing is called "over-polishing". On the other hand, in the case of performing over-polishing, even the insulating material other than the insulating material remaining on the stopper may be excessively polished in some cases. Thereby, dishing (a phenomenon in which the insulating material (the insulating material embedded in the concave portion of the substrate) other than the insulating material remaining on the stopper is excessively polished) proceeds, and thus flatness after polishing may be poor in same cases. Therefore, in the CMP technique, it is necessary to suppress excessive dishing during over-polishing.

In order to suppress excessive dishing, it is considered to use a polishing liquid having high polishing selectivity of an insulating material with respect to a stopper material (a polishing rate ratio of an insulating material with respect to a stopper material) (see, for example, Patent Literature 1 below).

CITATION LIST

Patent Literature

Patent Literature 1: Japanese Unexamined Patent Publication No. 2011-529269

SUMMARY OF INVENTION

Technical Problem

However, even in the case of using the polishing liquid having high polishing selectivity of an insulating material with respect to a stopper material, excessive dishing cannot be suppressed in some cases. Therefore, it is required to suppress excessive dishing when an insulating material is polished by using a stopper without focusing only on the polishing selectivity of an insulating material with respect to a stopper material.

An object of an aspect of the present disclosure is to provide a polishing liquid capable of suppressing excessive dishing when an insulating material is polished by using a stopper. An object of another aspect of the present disclosure is to provide a polishing liquid set for obtaining this polishing liquid. An object of still another aspect of the present disclosure is to provide a polishing method which uses the above-described polishing liquid or the above-described polishing liquid set.

Solution to Problem

An aspect of the present disclosure relates to a polishing liquid containing: abrasive grains; at least one hydroxy acid component selected from the group consisting of a hydroxy acid and a salt thereof; and a compound Z, in which the compound Z has a hydrocarbon group which may be substituted and a polyoxyalkylene group, and a Z value represented by General Formula (1) below is 20 or more:

$$Z = 0.1 \times a^2 \times b/c \quad (1)$$

[in Formula (1), "a" represents the number of carbon atoms of the hydrocarbon group, "b" represents the total number of oxyalkylene groups in the compound Z, and "c" represents an HLB value of the compound Z.]

Another aspect of the present disclosure relates to a polishing liquid set containing constituent components of the aforementioned polishing liquid separately stored as a first liquid and a second liquid, in which the first liquid contains the abrasive grains, and the second liquid contains the hydroxy acid component and the compound Z.

Still another aspect of the present disclosure relates to a polishing method including a polishing step of polishing a surface to be polished by using the aforementioned polishing liquid or a polishing liquid obtained by mixing the first liquid and the second liquid of the aforementioned polishing liquid set.

According to the polishing liquid, the polishing liquid set, and the polishing method mentioned above, excessive dishing can be suppressed when an insulating material is polished by using a stopper.

Advantageous Effects of Invention

According to the present disclosure, excessive dishing can be suppressed when an insulating material is polished by using a stopper. According to this, the flatness of the base substrate after the completion of over-polishing can be improved.

According to the present disclosure, it is possible to provide use of the polishing liquid in polishing of a surface to be polished containing silicon oxide. According to the present disclosure, it is possible to provide use of the polishing liquid in polishing of a surface to be polished containing silicon oxide and silicon nitride. According to the present disclosure, it is possible to provide use of the polishing liquid in selective polishing of silicon oxide with respect to silicon nitride. According to the present disclosure, it is possible to provide use of the polishing liquid in a flattening step of a base substrate surface that is the manufacturing technology of semiconductor elements. According to the present disclosure, it is possible to provide use of a polishing liquid in a flattening step of STI insulating materials, pre-metal insulating materials, or interlayer insulating materials. According to the present disclosure, it is possible to provide use of the polishing liquid in formation of STI.

DESCRIPTION OF EMBODIMENTS

Hereinafter, embodiments of the present disclosure will be described in detail. However, the present disclosure is not limited to the following embodiments.

Definition

In the present specification, a numerical range that has been indicated by use of "to" indicates the range that includes the numerical values which are described before and after "to", as the minimum value and the maximum value, respectively. "A or more" in the numerical range means A and a range of more than A. "A or less" in the numerical range means A and a range of less than A. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in Examples. "A or B" may include either one of A and B, and may also include both of A and B. Materials listed as examples in the present specification can be used singly or in combinations of two or more, unless otherwise specified. In the present specification, when a plurality of substances corresponding to each component exist in the composition, the content of each component in the composition means the total amount of the plurality of substances that exist in the composition, unless otherwise specified. The terms "film" and "layer" include a structure having a shape which is formed on a part, in addition to a structure having a shape which is formed on the whole surface, when the film has been observed as a plan view. The term "step" includes not only an independent step but also a step by which an intended action of the step is achieved, though the step cannot be clearly distinguished from other steps.

In the present specification, the term "polishing liquid" (abrasive) is defined as a composition to be brought into contact with a surface to be polished, at the time of polishing. The term "polishing liquid" itself does not limit any components contained in the polishing liquid. As described later, a polishing liquid of the present embodiment contains abrasive grains. While the abrasive grains are also referred to as "polishing particles", it is referred to as "abrasive grains" in the present specification. The abrasive grains are generally solid particles, and it is considered that a subject to be removed is removed by a mechanical action (physical action) of the abrasive grains and a chemical action of the abrasive grains (mainly surfaces of the abrasive grains) at the time of polishing, but the mechanism is not limited thereto.

<Polishing Liquid and Polishing Liquid Set>

A polishing liquid of the present embodiment (for example, a polishing liquid for CMP) contains: abrasive grains; at least one hydroxy acid component selected from the group consisting of a hydroxy acid and a salt thereof; and a compound Z, in which the compound Z has a hydrocarbon group which may be substituted and a polyoxyalkylene group, and a Z value (parameter Z value) represented by General Formula (1) below is 20 or more:

$$Z = 0.1 \times a^2 \times b/c \tag{1}$$

[in Formula (1), "a" represents the number of carbon atoms of the hydrocarbon group, "b" represents the total number of oxyalkylene groups in the compound Z, and "c" represents an HLB value of the compound Z.]

According to the polishing liquid of the present embodiment, it is possible to suppress excessive dishing when an insulating material (excluding a stopper material) is polished by using a stopper, and particularly, it is possible to suppress excessive dishing when silicon oxide is polished by using a stopper containing silicon nitride. Furthermore, according to the polishing liquid of the present embodiment, excessive polishing of the stopper at the time of over-polishing can be suppressed, and the stopper is easily removed when the stopper is removed by etching or the like after the over-polishing.

The present inventor has speculated reasons obtaining these effects as follows. However, the reasons are not limited to the reasons to be as follows.

The hydroxy acid component has an effect of easily suppressing an excessive increase in the polishing rate for the stopper material. Furthermore, by using the hydroxy acid component, it is easy to obtain high flatness by suppressing the polishing of an insulating material (an insulating material embedded in the concave portion of the substrate) other than an insulating material remaining on a stopper after exposure of the stopper. As for these reasons, the functional group (such as a carboxy group, a carboxylate group, or a hydroxyl group) of the hydroxy acid component is adsorbed to a stopper and an insulating material to cover these materials to be polished, and thus the abrasive grains are suppressed from being in contact with the stopper and the insulating material. Thereby, it is speculated that progression of polishing by the abrasive grains is moderated to suppress excessive increase in the polishing rate, and thus excessive dishing is suppressed.

It is speculated that the compound Z has actions of forming a protective layer on the insulating material so as to polish the insulating material to be polished at a suitable rate. Furthermore, by using the compound Z, it is easy to obtain high flatness by suppressing the polishing of an insulating material (an insulating material embedded in the concave portion of the substrate) other than an insulating material remaining on a stopper after exposure of the stopper. As for these reasons, the hydrocarbon group (hydrophobic part) and the polyoxyalkylene group (hydrophilic part) of the compound Z are adsorbed to an insulating material to cover the insulating material, and thus the abrasive grains are suppressed from being in contact with the insulating material. Thereby, it is speculated that progression of polishing by the abrasive grains is moderated to suppress excessive increase in the polishing rate for an insulating material, and thus excessive dishing is suppressed.

As described above, it is considered that both of the hydrocarbon group (hydrophobic part) and the polyoxyalkylene group (hydrophilic part) of the compound Z are adsorbed to the insulating material to exhibit the protection effect.

Since it is considered that the oxygen atom of the polyoxyalkylene group that is the hydrophilic part is an adsorption point with respect to an insulating material, it is speculated that, as the total number of oxyalkylene groups in the compound Z is larger (that is, the number of adsorption points is larger), the compound Z is strongly adsorbed to the insulating material. Therefore, it is considered that, the compound Z is difficult to desorb from the insulating material in the process of polishing, and excessive dishing is suppressed.

Furthermore, generally, since a compound having a large number carbon atoms and a compound having a small HLB value have high hydrophobicity, interaction with a water molecule having a high polarity is small in water and stabilization is difficult to be attained by hydration, and thus, the surface energy of the molecule is increased. Further, it has been known that a molecule having a high hydrophobicity is adsorbed to an interface so as to decrease the surface energy thereof. Therefore, it is considered that, since the interface energy of the compound Z is high and the compound Z is easily adsorbed to an insulating material as the number of hydrocarbon groups (hydrophobic parts) of the compound Z is larger and the HLB value of the compound Z is smaller, the effect of protecting the insulating material is high. Further, it is also considered that, since steric hindrance is larger as the molecular weight of the compound Z is larger with increasing the number of carbon atoms of the hydrocarbon group, the effect that the insulating material to which the compound Z is adsorbed can be protected from the polishing action of the abrasive grains is obtainable.

From the above reasons, it is speculated to obtain the effect of suppressing excessive dishing when an insulating material is polished by using a stopper, and the like.

The Z value of the compound Z will be described. As a result of studies, the present inventor has found that it is effective to adjust the Za value represented by General Formula (1a) below of the compound Z having a hydrocarbon group which may be substituted and a polyoxyalkylene group when an insulating material is polished by using a stopper for suppressing excessive polishing of the insulating material so that excessive dishing of the insulating material is suppressed to obtain a high flatness, and the aforementioned Z value has been found on the basis of such a Za value.

$$Za = \sigma \times a^\gamma \times b/c \tag{1a}$$

[in Formula (1a), "a" represents the number of carbon atoms of the hydrocarbon group of the compound Z, "b" represents the total number of oxyalkylene groups in the compound Z, "c" represents an HLB value of the compound Z, and γ and σ represent weighting coefficients of parameters.]

The procedure of deriving the Z value on the basis of the Za value will be described. First, constituent elements of the Za value can be resolved by two formulas described below.

$$a^\gamma \times b \tag{Formula (i):}$$

$$\sigma/c \tag{Formula (ii):}$$

Formula (i) is set mainly as an index relating to the number of adsorption points of the compound Z with respect to an insulating material. As a result of studies on each parameter, it has been found that the effect of suppressing dishing is larger as the number of carbon atoms "a" of the hydrocarbon group (hydrophobic part) is larger, and the effect of suppressing dishing is larger as the total number "b" of oxyalkylene groups is larger. The reason for this is considered that the number of adsorption points with respect to an insulating material is increased. Furthermore, since the steric structure of the molecule is larger as the parameters "a" and "b" are larger and the abrasive grains are difficult to be close to an insulating material to which the compound Z is adsorbed so that the insulating material can be effectively protected, the parameters "a" and "b" are considered to act synergistically, and thereby formula "$a^\gamma \times b$" was obtained. Herein, from the result of studies, since the influence of the number of carbon atoms "a" of the hydrocarbon group (hydrophobic part) on the effect of suppressing dishing is larger than that of the total number "b" of oxyalkylene groups, the weighting coefficient γ of the parameter "a" was set to 2.

Formula (ii) is set mainly as an index relating to the affinity of the compound Z with respect to water. The "HLB value" is an index indicating affinity of a compound (such as a surfactant) with respect to water, oil (an organic compound insoluble to water), or the like, and as the HLB value is higher, the affinity to water is higher and the compound Z is easily dissolved. As a result of studies, it has been found that, as the HLB value is smaller (the affinity to water is lower), the effect of suppressing dishing is larger. As the HLB value is smaller (the affinity to water is lower), hydrophobicity tends to increase. As described above, it is considered that, since a molecule having a high hydrophobicity is difficult to be stabilized in water by hydration, the molecule is adsorbed to the interface to reduce the surface energy thereof, and is likely to be adsorbed to an insulating material, so that the effect of protecting the insulating material is high. Since dishing is easily suppressed as the HLB value is smaller in this way, the reciprocal of the HLB value was taken to obtain formula "1/c". Herein, since the HLB value is a small value of 0 to 20, the weighting coefficient σ of the parameter "c" was set to 0.1 in consideration of the magnitude of the influence on suppression of dishing.

Further, it is considered that, regarding adsorption with respect to an insulating material, the parameters set by these Formula (i) and Formula (ii) contribute together rather than individually. Therefore, since it is considered that the parameters act synergistically instead of merely additively, the product of Formula (i) and Formula (ii) were set to obtain Formula (1) of the Z value. Further, it has been found that dishing can be suppressed in a case where such a Z value is 20 or more.

(Abrasive Grains)

The polishing liquid of the present embodiment contains abrasive grains. The abrasive grains may contain at least one selected from the group consisting of a cerium oxide (for example, ceria (cerium (IV) oxide)), silica, alumina, zirconia, yttria, and a hydroxide of a tetravalent metal element and may contain a cerium oxide, from the viewpoint of easily polishing an insulating material to be removed at a high polishing rate.

The "hydroxide of a tetravalent metal element" is a compound containing a tetravalent metal ($M^{4+}$) and at least one hydroxide ion ($OH^-$). The hydroxide of a tetravalent metal element may contain an anion (for example, nitrate ion $NO_3^-$ and a sulfate ion $SO_4^{2-}$) other than a hydroxide ion. For example, the hydroxide of a tetravalent metal element may contain an anion (for example, a nitrate ion $NO_3^-$ and a sulfate ion $SO_4^{2-}$) bound to the tetravalent metal element. The hydroxide of a tetravalent metal element can be prepared by reacting a salt (metal salt) of a tetravalent metal element with an alkali source (base).

The abrasive grains may contain cerium hydroxide (hydroxide of tetravalent cerium) from the viewpoint of easily improving the polishing rate for an insulating material to be removed. The cerium hydroxide can be prepared by reacting a cerium salt with an alkali source (base). The cerium hydroxide may be prepared by mixing a cerium salt with an alkali liquid (for example, alkali aqueous solution). This makes it possible to obtain particles having an extremely fine particle diameter, and easily obtain an excellent effect of reducing polishing scratches. The cerium hydroxide can be obtained by mixing a cerium salt solution (for example, cerium salt aqueous solution) with alkali liquid. Examples of cerium salt include $Ce(NO_3)_4$, $Ce(SO_4)_2$, $Ce(NH_4)_2(NO_3)_6$, and $Ce(NH_4)_4(SO_4)_4$.

It is considered that particles including $Ce(OH)_a X_b$ (in the formula, $a+b \times c=4$) composed of tetravalent cerium ($Ce^{4+}$), one to three hydroxide ions ($OH^-$), and one to three anions ($X^{c-}$) are generated (incidentally, such particles are also "cerium hydroxide") depending on production conditions of cerium hydroxide and the like. It is considered that, in $Ce(OH)_a X_b$, an electron-withdrawing anion ($X^{c-}$) acts to enhance reactivity of the hydroxide ion and the polishing rate is improved with the increase in abundance of $Ce(OH)_a X_b$. Examples of the anion ($X^{c-}$) include $NO_3^-$ and $SO_4^{2-}$. It is considered that the particles containing cerium hydroxide can contain not only $Ce(OH)_a X_b$ but also $Ce(OH)_4$, $CeO_2$, or the like.

The containing of $Ce(OH)_a X_b$ in the particles containing cerium hydroxide can be confirmed by a method for detecting a peak corresponding to the anions ($X^{c-}$) with FT-IR ATR method (Fourier transform Infra Red Spectrometer Attenuated Total Reflection method) after washing the particles with pure water well. The existence of the anions ($X^{c-}$) can also be confirmed by XPS method (X-ray Photoelectron Spectroscopy).

In a case where the abrasive grains contain a cerium oxide, the lower limit of the content of the cerium oxide may be 50% by mass or more, more than 50% by mass, 60% by mass or more, 70% by mass or more, 80% by mass or more, or 90% by mass or more, on the basis of the whole abrasive grains (the whole abrasive grains contained in the polishing liquid; the same applies hereinafter), from the viewpoint of easily improving the polishing rate for an insulating material to be removed.

The lower limit of the average particle diameter of the abrasive grains in the polishing liquid or a slurry of the polishing liquid set described later may be 16 nm or more, 20 nm or more, 30 nm or more, 40 nm or more, 50 nm or more, 100 nm or more, 120 nm or more, 150 nm or more, or 155 nm or more, from the viewpoint of easily improving the polishing rate for an insulating material to be removed. The upper limit of the average particle diameter of the abrasive grains may be 1050 nm or less, 1000 nm or less, 800 nm or less, 600 nm or less, 500 nm or less, 400 nm or less, 300 nm or less, 200 nm or less, or 160 nm or less, from the viewpoint of easily suppressing scratches at a polished surface. From these viewpoints, the average particle diameter of the abrasive grains may be 16 to 1050 nm or 20 to 1000 nm.

The "average particle diameter" of the abrasive grains means an average secondary particle diameter of the abrasive grains. For example, the average particle diameter of the abrasive grains is the volume average particle diameter, and it can be measured, for the polishing liquid or the slurry of the polishing liquid set described later, using an optical diffraction scattering particle size distribution meter (for example, trade name: Microtrac MT3300EXII manufactured by MicrotracBEL Corp.).

The zeta potential (surface potential) of the abrasive grains in the polishing liquid may be positive (the zeta potential exceeds 0 mV) from the viewpoint of easily suppressing excessive dishing and the viewpoint of easily suppressing excessive polishing of the stopper at the time of over-polishing. The lower limit of the zeta potential of the abrasive grains may be 10 mV or more, 20 mV or more, 25 mV or more, 30 mV or more, 40 mV or more, or 50 mV or more, from the viewpoint of easily suppressing excessive dishing and the viewpoint of easily suppressing excessive polishing of the stopper at the time of over-polishing. The upper limit of the zeta potential of the abrasive grains is not particularly limited, but may be 200 mV or less. From these viewpoints, the zeta potential of the abrasive grains may be 10 to 200 mV.

The zeta potential of the abrasive grains can be measured, for example, by using a dynamic light scattering type zeta potential measurement apparatus (for example, trade name: DelsaNano C manufactured by Beckman Coulter, Inc.). The zeta potential of the abrasive grains can be adjusted using an additive. For example, by bringing a monocarboxylic acid (acetic acid or the like) into contact with abrasive grains containing a cerium oxide, abrasive grains having a positive zeta potential can be obtained.

The content of the abrasive grains may be in the following range on the basis of the total mass of the polishing liquid. The lower limit of the content of the abrasive grains may be 0.005% by mass or more, 0.01% by mass or more, 0.02% by mass or more, 0.03% by mass or more, 0.04% by mass or more, 0.05% by mass or more, 0.07% by mass or more, 0.08% by mass or more, or 0.1% by mass or more, from the viewpoint of easily improving the polishing rate for an insulating material to be removed. The upper limit of the content of the abrasive grains may be 20% by mass or less, 15% by mass or less, 10% by mass or less, 5% by mass or less, 4% by mass or less, 3% by mass or less, 1% by mass or less, 0.5% by mass or less, 0.3% by mass or less, 0.2% by mass or less, or 0.1% by mass or less, from the viewpoint of easily obtaining excellent dispersion stability of the abrasive grains. From these viewpoints, the content of the abrasive grains may be 0.005 to 20% by mass or 0.01 to 10% by mass.

The abrasive grains may include composite particles composed of a plurality of particles in contact with each other. For example, the abrasive grains may include composite particles including first particles and second particles in contact with the first particles or may include composite particles and free particles (for example, second particles not in contact with first particles).

The abrasive grains may be an embodiment including first particles and second particles in contact with the first particles, in which the particle diameter of the second particles is smaller than the particle diameter of the first particles, the first particles contain a cerium oxide, and the second particles contain a cerium compound, as an embodiment including composite particles. By using such abrasive grains, the polishing rate for an insulating material to be removed (for example, silicon oxide) is easily improved. The reasons why the polishing rate for an insulating material is improved in this way are, for example, the reasons to be as follows. However, the reasons are not limited to the reasons to be as follows.

That is, the first particles containing a cerium oxide and having a larger particle diameter than that of the second particles have strong mechanical action (mechanical property) with respect to an insulating material as compared to the second particles. On the other hand, the second particles containing a cerium compound and having a smaller particle diameter than that of the first particles have small mechanical action with respect to an insulating material as compared to the first particles, but have strong chemical action (chemical property) with respect to an insulating material since the specific surface area (surface area per unit mass) in the whole particle is large. Therefore, a synergetic effect of improving the polishing rate is easily obtained by using the first particles having strong mechanical action and the second particles having strong chemical action.

Examples of the cerium compound of the second particles include a cerium hydroxide and a cerium oxide. As the cerium compound of the second particles, a compound different from a cerium oxide can be used. The cerium compound may contain a cerium hydroxide from the viewpoint of easily improving the polishing rate for an insulating material to be removed.

The particle diameter of the second particles may be smaller than the particle diameter of the first particles. The magnitude relationship in particle diameter between the first particles and the second particles can be determined from SEM images of the composite particles, or the like. In general, particles having a small particle diameter have a larger surface area per unit mass than that of particles having a large particle diameter, and thus have higher reaction activity. On the other hand, the mechanical action (mechanical polishing force) of particles having a small particle diameter is smaller than that of particles having a large particle diameter. However, in the present embodiment, even in a case where the particle diameter of the second particles is smaller than the particle diameter of the first particles, the synergetic effect of the first particles and the second particles can be expressed and both of excellent reaction activity and excellent mechanical action can be easily achieved.

The lower limit of the particle diameter of the first particles may be 15 nm or more, 25 nm or more, 35 nm or more, 40 nm or more, 50 nm or more, 80 nm or more, or 100 nm or more, from the viewpoint of easily improving the polishing rate for an insulating material to be removed. The upper limit of the particle diameter of the first particles may be 1000 nm or less, 800 nm or less, 600 nm or less, 400 nm or less, 300 nm or less, 200 nm or less, or 150 nm or less, from the viewpoint of easily improving the dispersibility of the abrasive grains and from the viewpoint of easily suppressing scratches at a polished surface. From these viewpoints, the particle diameter of the first particles may be 15 to 1000 nm. The average particle diameter (average secondary particle diameter) of the first particles may be in the aforementioned ranges.

The lower limit of the particle diameter of the second particles may be 1 nm or more, 2 nm or more, or 3 nm or more, from the viewpoint of easily improving the polishing rate for an insulating material to be removed. The upper limit of the particle diameter of the second particles may be 50 nm or less, 30 nm or less, 25 nm or less, 20 nm or less, 15 nm or less, or 10 nm or less, from the viewpoint of easily improving the dispersibility of the abrasive grains and from the viewpoint of easily suppressing scratches at a polished surface. From these viewpoints, the particle diameter of the second particles may be 1 to 50 nm. The average particle diameter (average secondary particle diameter) of the second particles may be in the aforementioned ranges.

The composite particles including the first particles and the second particles can be obtained by bringing the first particles and the second particles into contact with each other using a homogenizer, a nanomizer, a ball mill, a bead mill, a sonicator, or the like; by bringing the first particles and the second particles each having opposing charges to each other into contact with each other; by bringing the first particles and the second particles into contact with each other in a state of a small content of the particles; or the like. The first particles can have a negative zeta potential. The second particles can have a positive zeta potential.

(Additive)

The polishing liquid of the present embodiment contains an additive. Here, "additive" refers to a substance that is contained in the polishing liquid in addition to the abrasive grains and a liquid medium.

[Hydroxy Acid Component]

The polishing liquid of the present embodiment contains at least one hydroxy acid component selected from the group consisting of a hydroxy acid and a salt thereof. The hydroxy acid is a compound having one or more carboxy groups and one or more hydroxyl groups. In the salt of a hydroxy acid, a hydrogen atom of at least one carboxy group is substituted with a metal atom (for example, an alkali metal atom). Examples of the salt of a hydroxy acid include a sodium salt and a potassium salt. "—OH" in carboxy group is not included in the "hydroxyl group". The "hydroxyl group" may be either an alcoholic hydroxyl group or a phenolic hydroxyl group. The hydroxy acid component may not have a phenolic hydroxyl group.

The total number of the carboxy group and the carboxylate group in the hydroxy acid component (the total number of the carboxy group and the carboxylate group in one molecule) may be in the following range, from the viewpoint of easily suppressing excessive dishing and the viewpoint of easily suppressing excessive polishing of the stopper at the time of over-polishing. The total number of the carboxy group and the carboxylate group may be 1 or more. The total number of the carboxy group and the carboxylate group may be 3 or less or 2 or less. From these viewpoints, the total number of the carboxy group and the carboxylate group may be 1 to 3 or 1 to 2, and may be 1.

The number of a hydroxyl group in the hydroxy acid component (the number of a hydroxyl group in one molecule) may be in the following range, from the viewpoint of easily suppressing excessive dishing and the viewpoint of easily suppressing excessive polishing of the stopper at the time of over-polishing. The number of a hydroxyl group may be 1 or more, 2 or more, or 3 or more. The number of a hydroxyl group may be 3 or less or 2 or less. From these viewpoints, the number of a hydroxyl group may be 1 to 3 or 1 to 2, and may be 2.

The hydroxy acid component may contain a compound having one carboxy group and one hydroxyl group, may contain a compound having one carboxy group and two hydroxyl groups, or may contain a compound having one carboxy group and three hydroxyl groups.

Examples of the hydroxy acid component include glycolic acid, glyceric acid, lactic acid (for example, DL-lactic acid), 2,2-bis(hydroxymethyl) propionic acid, 2,2-bis(hydroxymethyl) butyric acid, N,N-bis(2-hydroxyethyl)glycine, N-[2-hydroxy-1,1-bis(hydroxymethyl)ethyl]glycine, bicin, tricine, tyrosine, serine, and salts of these. From the viewpoint of easily suppressing excessive dishing and the viewpoint of easily suppressing excessive polishing of the stopper at the time of over-polishing, the hydroxy acid component may contain at least one selected from the group consisting of lactic acid, 2,2-bis(hydroxymethyl) propionic acid, 2,2-bis(hydroxymethyl) butyric acid, tricine, and salts of these.

The hydroxy acid component may contain at least one selected from the group consisting of an aliphatic hydroxy acid and a salt thereof, from the viewpoint of easily obtaining excellent dispersion stability of the abrasive grains, the viewpoint of easily suppressing excessive dishing, and the viewpoint of easily suppressing excessive polishing of the stopper at the time of over-polishing. The hydroxy acid component may contain at least one selected from the group consisting of a hydroxy acid containing a nitrogen atom and a salt thereof, and may contain at least one selected from the group consisting of a hydroxy acid not containing a nitrogen atom and a salt thereof.

The content of the hydroxy acid component may be in the following range on the basis of the total mass of the polishing liquid. The lower limit of the content of the hydroxy acid component may be 0.01% by mass or more, 0.03% by mass or more, 0.05% by mass or more, 0.1% by mass or more, 0.2% by mass or more, 0.3% by mass or more, or 0.4% by mass or more, from the viewpoint of easily suppressing excessive dishing and the viewpoint of easily suppressing excessive polishing of the stopper at the time of over-polishing. The upper limit of the content of the hydroxy acid component may be 5.0% by mass or less, 2.0% by mass or less, 1.0% by mass or less, 0.8% by mass or less, 0.6% by mass or less, 0.5% by mass or less, or 0.4% by mass or less, from the viewpoint of easily obtaining a suitable polishing rate for an insulating material, the viewpoint of easily suppressing excessive dishing, and the viewpoint of easily suppressing excessive polishing of the stopper at the time of over-polishing. From these viewpoints, the content of the hydroxy acid component may be 0.01 to 5.0% by mass, or 0.01 to 1.0% by mass.

The content of the hydroxy acid component may be in the following range with respect to 100 parts by mass of the abrasive grains. The lower limit of the content of the hydroxy acid component may be 10 parts by mass or more, 50 parts by mass or more, 100 parts by mass or more, 150 parts by mass or more, 200 parts by mass or more, 250 parts by mass or more, 300 parts by mass or more, 350 parts by mass or more, or 400 parts by mass or more, from the viewpoint of easily suppressing excessive dishing and the viewpoint of easily suppressing excessive polishing of the stopper at the time of over-polishing. The upper limit of the content of the hydroxy acid component may be 1000 parts by mass or less, 800 parts by mass or less, 600 parts by mass or less, 550 parts by mass or less, 500 parts by mass or less, 450 parts by mass or less, or 400 parts by mass or less, from the viewpoint of easily obtaining a suitable polishing rate for an insulating material, the viewpoint of easily suppressing excessive dishing, and the viewpoint of easily suppressing excessive polishing of the stopper at the time of over-polishing. From these viewpoints, the content of the hydroxy acid component may be 10 to 1000 parts by mass or 100 to 500 parts by mass.

[Compound Z]

The polishing liquid of the present embodiment contains, as the compound Z, a compound (excluding a compound corresponding to the hydroxy acid component) having a hydrocarbon group x which may be substituted and a polyoxyalkylene group. In the compound Z, the Z value represented by General Formula (1) below is 20 or more:

$$Z = 0.1 \times a^2 \times b/c \tag{1}$$

[in Formula (1), "a" represents the number of carbon atoms of the hydrocarbon group x of the compound Z, "b" represents the total number of oxyalkylene groups in the compound Z, and "c" represents an HLB value of the compound Z.]

As the hydrocarbon group x, a monovalent hydrocarbon group such as an alkyl group or an aryl group can be used. The hydrocarbon group x may contain at least one selected from the group consisting of an alkyl group and an aryl group from the viewpoint of easily suppressing excessive dishing and the viewpoint of easily suppressing excessive polishing of the stopper at the time of over-polishing. The "alkyl group" may be linear, branched, or cyclic. Examples of the alkyl group include a decyl group, a lauryl group, a cetyl group, a stearyl group, and a behenyl group. The alkyl group may contain a saturated alkyl group from the viewpoint of easily suppressing excessive dishing and the viewpoint of easily suppressing excessive polishing of the stopper at the time of over-polishing. Examples of the aryl group include a phenyl group, a substituted phenyl group (such as a styrenated phenyl group, a distyrenated phenyl group, or a tristyrenated phenyl group), and a polycyclic phenyl group (such as a naphthyl group). The number of hydrocarbon groups x in the compound Z may be 1, 2, or 3 from the viewpoint of easily suppressing excessive dishing and the viewpoint of easily suppressing excessive polishing of the stopper at the time of over-polishing.

The hydrocarbon group x may or may not be substituted. In the substituted hydrocarbon group, at least one hydrogen atom of the hydrocarbon group is substituted with a substituent, and may be a group containing a hetero atom such as a nitrogen atom (for example, an alkylamino group). Examples of the substituent include a hydroxyl group, an alkoxy group, a carboxy group, a carboxylate group, and an amino group. The hydrocarbon group x does not include a hydrocarbon portion that constitutes the oxyalkylene group in the polyoxyalkylene group.

The hydrocarbon group x may be directly bonded to the polyoxyalkylene group, and may be bonded to the polyoxyalkylene group via another atom. The compound Z may contain a compound having an oxygen atom to which the hydrocarbon group x and the polyoxyalkylene group are bonded, and may contain a compound having a nitrogen atom to which the hydrocarbon group x and the polyoxyalkylene group are bonded, from the viewpoint of easily suppressing excessive dishing and the viewpoint of easily suppressing excessive polishing of the stopper at the time of over-polishing.

The lower limit of the number of carbon atoms of the hydrocarbon group x is 1 or more and may be 3 or more, 5 or more, 8 or more, 10 or more, 12 or more, 15 or more, 18 or more, 20 or more, 21 or more, 24 or more, 27 or more, or 30 or more, from the viewpoint of easily suppressing excessive dishing and the viewpoint of easily suppressing excessive polishing of the stopper at the time of over-polishing. The upper limit of the number of carbon atoms of the hydrocarbon group x may be 50 or less, 40 or less, 35 or less, 30 or less, 27 or less, 24 or less, 21 or less, or 18 or less, from the viewpoint of easily suppressing excessive dishing and the viewpoint of easily suppressing excessive polishing of the stopper at the time of over-polishing. The number of carbon atoms of the hydrocarbon group x may be 1 to 50, 10 to 40, or 12 to 30. In a case where the compound Z has a plurality of hydrocarbon groups x, the number of carbon atoms of the hydrocarbon group x ("a" of Formula (1)) indicates the total number of carbon atoms of the hydrocarbon group x contained in the compound Z.

Examples of the polyoxyalkylene group include a polyoxyethylene group and a polyoxypropylene group. The polyoxyalkylene group may contain a polyoxyethylene group from the viewpoint of easily suppressing excessive dishing and the viewpoint of easily suppressing excessive polishing of the stopper at the time of over-polishing. The number of polyoxyalkylene groups in the compound Z may be 1, 2, or 3 from the viewpoint of easily suppressing excessive dishing and the viewpoint of easily suppressing excessive polishing of the stopper at the time of over-polishing.

The total number of oxyalkylene groups ("b" of Formula (1)) in the compound Z is the total number of oxyalkylene groups (such as an oxyethylene group and an oxypropylene group) contained in the compound Z. The lower limit of the total number of oxyalkylene groups is 2 or more, and may be 3 or more, 5 or more, 8 or more, 10 or more, 12 or more, 14 or more, 15 or more, 20 or more, 23 or more, 25 or more, 30 or more, 40 or more, 50 or more, 60 or more, 70 or more, or 80 or more, from the viewpoint of easily suppressing excessive dishing and the viewpoint of easily suppressing excessive polishing of the stopper at the time of over-polishing. The upper limit of the total number of oxyalkylene groups may be 100 or less, 90 or less, 80 or less, 70 or less, 60 or less, 50 or less, 40 or less, 30 or less, 25 or less, 23 or less, 20 or less, 15 or less, or 14 or less, from the viewpoint of easily suppressing excessive dishing and the viewpoint of easily suppressing excessive polishing of the stopper at the time of over-polishing. From these viewpoints, the total number of oxyalkylene groups may be 2 to 100, 10 to 80, or 14 to 80.

The HLB value of the compound Z is an index indicating affinity of a compound (such as a surfactant) with respect to water, oil (an organic compound insoluble to water), or the like and can be calculated by the following formula on the basis of the Griffin's method. The HLB value is a value of 0 to 20.0. As the HLB value is close to 0, lipophilicity is high, and as the HLB value is close to 20.0, hydrophilicity is high. That is, as the HLB value is higher, the compound Z is easily dissolved in water.

$HLB$ value=20.0×[(Sum of formula weight of polyoxyalkylene)/(Molecular weight of compound)]

The lower limit of the HLB value of the compound Z may be 8.0 or more, 9.0 or more, 10.0 or more, 11.0 or more, 12.0 or more, 13.0 or more, 14.0 or more, 14.5 or more, 15.0 or more, 16.0 or more, 16.5 or more, 17.0 or more, 18.0 or more, or 18.5 or more, from the viewpoint of having excellent solubility in water, the viewpoint of easily suppressing excessive dishing, and the viewpoint of easily suppressing excessive polishing of the stopper at the time of over-polishing. The upper limit of the HLB value of the compound Z may be 19.0 or less, 18.5 or less, 18.0 or less, 17.0 or less, 16.5 or less, 16.0 or less, 15.0 or less, or 14.5 or less, from the viewpoint of easily suppressing excessive dishing and the viewpoint of easily suppressing excessive polishing of the stopper at the time of over-polishing. From these viewpoints, the HLB value of the compound Z may be 8.0 to 20.0.

The lower limit of the Z value may be 30 or more, 40 or more, 45 or more, 50 or more, 80 or more, 90 or more, 100 or more, 120 or more, 125 or more, 150 or more, 200 or more, 250 or more, 300 or more, 350 or more, or 380 or more, from the viewpoint of easily suppressing excessive dishing and the viewpoint of easily suppressing excessive polishing of the stopper at the time of over-polishing. The upper limit of the Z value may be 1000 or less, 800 or less, 700 or less, 600 or less, 500 or less, 400 or less, or 390 or less, from the viewpoint of easily obtaining an excellent polishing rate for an insulating material to be removed, the viewpoint of easily suppressing excessive dishing, and the viewpoint of easily suppressing excessive polishing of the stopper at the time of over-polishing. From these viewpoints, the Z value may be 30 to 1000 or 40 to 1000.

The compound Z may contain a compound represented by General Formula (z1) below from the viewpoint of easily suppressing excessive dishing and the viewpoint of easily suppressing excessive polishing of the stopper at the time of over-polishing. The hydrocarbon group x of the compound represented by General Formula (z1) may be an aryl group and may be an aryl group having a plurality of aromatic rings, from the viewpoint of easily suppressing excessive dishing and the viewpoint of easily suppressing excessive polishing of the stopper at the time of over-polishing.

[Chemical Formula 1]

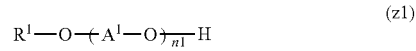

(z1)

[in Formula (z1), $A^1$ represents an alkylene group, $R^1$ represents the hydrocarbon group x, and n1 represents an integer of 2 or more.]

Examples of the alkylene group for $A^1$ include an ethylene group and a propylene group. The hydrocarbon group x for $R^1$ may satisfy the aforementioned respective features for the hydrocarbon group x. n1 may be in the aforementioned range as the range of the total number of oxyalkylene groups ("b" of Formula (1)).

The compound Z may contain a compound represented by General Formula (z2) below from the viewpoint of easily suppressing excessive dishing and the viewpoint of easily suppressing excessive polishing of the stopper at the time of over-polishing. The hydrocarbon group x of the compound represented by General Formula (z2) may be an alkyl group from the viewpoint of easily suppressing excessive dishing and the viewpoint of easily suppressing excessive polishing of the stopper at the time of over-polishing.

[Chemical Formula 2]

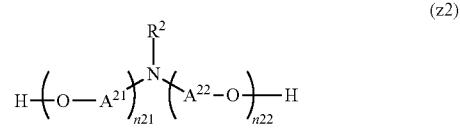

(z2)

[in Formula (z2), $A^{21}$ and $A^{22}$ each independently represent an alkylene group, $R^2$ represents the hydrocarbon group x, and n21 and n22 each independently represent an integer of 2 or more.]

Examples of the alkylene group for $A^{21}$ and $A^{22}$ include an ethylene group and a propylene group. The hydrocarbon group x for $R^2$ may satisfy the aforementioned respective features for the hydrocarbon group x. The total of n21 and n22 may be in the aforementioned range as the range of the total number of oxyalkylene groups ("b" of Formula (1)).

The compound Z may contain at least one selected from the group consisting of polyoxyethylene alkylamine (for example, polyoxyethylene stearyl amine), polyoxyethylene distyrenated phenyl ether, and polyoxyethylene polycyclic phenyl ether, from the viewpoint of easily suppressing excessive dishing and the viewpoint of easily suppressing excessive polishing of the stopper at the time of over-polishing.

The compound Z may contain a nonionic surfactant from the viewpoint of easily suppressing excessive dishing and the viewpoint of easily suppressing excessive polishing of the stopper at the time of over-polishing. An ionic surfactant (such as an anionic surfactant, a cationic surfactant, or an ampholytic surfactant) is a surfactant that ionizes and becomes an ion, and a nonionic surfactant is a surfactant that ionizes and does not become an ion.

In a case where the compound Z contains a nonionic surfactant, the lower limit of the content of the compound Z may be 50% by mass or more, 70% by mass or more, 90% by mass or more, 95% by mass or more, or 99% by mass or more, on the basis of the total mass of the surfactant (the total amount of the surfactant in the polishing liquid), from the viewpoint of easily suppressing excessive dishing and the viewpoint of easily suppressing excessive polishing of the stopper at the time of over-polishing. The surfactant contained in the polishing liquid may be an embodiment substantially composed of the compound Z (an embodiment in which the content of the compound Z is substantially 100% by mass on the basis of the total mass of the surfactant contained in the polishing liquid).

The lower limit of the content of the compound Z may be in the following range on the basis of the total mass of the polishing liquid. The lower limit of the content of the compound Z may be 0.01% by mass or more, 0.02% by mass or more, 0.03% by mass or more, 0.04% by mass or more, or 0.05% by mass or more, from the viewpoint of easily suppressing excessive dishing and the viewpoint of easily suppressing excessive polishing of the stopper at the time of over-polishing. The upper limit of the content of the compound Z may be 5.0% by mass or less, 2.0% by mass or less, 1.0% by mass or less, 0.8% by mass or less, 0.5% by mass or less, 0.3% by mass or less, 0.2% by mass or less, 0.1% by mass or less, 0.08% by mass or less, or 0.05% by mass or less, from the viewpoint of easily obtaining a suitable polishing rate for an insulating material, the viewpoint of easily suppressing excessive dishing, and the viewpoint of easily suppressing excessive polishing of the stopper at the time of over-polishing. From these viewpoints, the content of the compound Z may be 0.01 to 5.0% by mass or 0.01 to 2.0% by mass.

The content of the compound Z may be in the following range with respect to 100 parts by mass of the abrasive grains. The lower limit of the content of the compound Z may be 1 part by mass or more, 5 parts by mass or more, 10 parts by mass or more, 20 parts by mass or more, 25 parts by mass or more, 30 parts by mass or more, 35 parts by mass or more, or 40 parts by mass or more, from the viewpoint of easily suppressing excessive dishing and the viewpoint of easily suppressing excessive polishing of the stopper at the time of over-polishing. The upper limit of the content of the compound Z may be 100 parts by mass or less, 80 parts by mass or less, 60 parts by mass or less, 55 parts by mass or less, 50 parts by mass or less, 45 parts by mass or less, or 40 parts by mass or less, from the viewpoint of easily obtaining a suitable polishing rate for an insulating material, the viewpoint of easily suppressing excessive dishing, and the viewpoint of easily suppressing excessive polishing of the stopper at the time of over-polishing. From these viewpoints, the content of the compound Z may be 1 to 100 parts by mass or 10 to 50 parts by mass.

The content of the compound Z may be in the following range with respect to 100 parts by mass of the hydroxy acid component. The lower limit of the content of the compound Z may be 1 part by mass or more, 3 parts by mass or more, 5 parts by mass or more, 8 parts by mass or more, 10 parts by mass or more, 12 parts by mass or more, or 12.5 parts by mass or more, from the viewpoint of easily suppressing excessive dishing and the viewpoint of easily suppressing excessive polishing of the stopper at the time of over-polishing. The upper limit of the content of the compound Z may be 100 parts by mass or less, 80 parts by mass or less, 60 parts by mass or less, 50 parts by mass or less, 30 parts by mass or less, 20 parts by mass or less, 15 parts by mass or less, or 12.5 parts by mass or less, from the viewpoint of easily obtaining a suitable polishing rate for an insulating material, the viewpoint of easily suppressing excessive dishing, and the viewpoint of easily suppressing excessive polishing of the stopper at the time of over-polishing. From these viewpoints, the content of the compound Z may be 1 to 100 parts by mass or 5 to 50 parts by mass.

[Arbitrary Additive]

The polishing liquid of the present embodiment may contain an arbitrary additive other than the hydroxy acid component and the compound Z. Examples of the arbitrary additive include pH adjusting agents; surfactants not corresponding to the compound Z; water-soluble polymers; oxidants (for example, hydrogen peroxide); and dispersants (for example, a phosphoric acid-based inorganic salt).

In the polishing liquid of the present embodiment, the pH can be adjusted to a desired pH by using a pH adjusting agent. Examples of the pH adjusting agent include an acid component and an alkali component. Examples of the acid component include amino acids such as glycine, serine, cysteine, glutamine, and alanine; inorganic acids; and organic acids. Examples of the alkali component include ammonia, sodium hydroxide, tetramethylammonium hydroxide (TMAH), imidazole, and alkanolamine. A buffering agent may be used in order to stabilize the pH. A buffering agent may be supplied by a buffer solution (a liquid containing a buffering agent). Examples of the buffer solution include an acetate buffer solution and a phthalate buffer solution.

Examples of the surfactant not corresponding to the compound Z include polyoxyethylene (7) laurylamine and polyoxyethylene (11) cumyl phenyl ether. The "water-soluble polymer" is defined as a polymer which is dissolved in 100 g of water in an amount of 0.1 g or more. Examples of the water-soluble polymer include polyols such as polyglycerol, polyvinyl alcohol, and polyalkylene glycol; and cationic polymers such as an acrylate having a quaternary ammonium salt group, polyallylamine hydrochloride, and polyethyleneimine.

The polishing liquid of the present embodiment may be an embodiment substantially not containing the oxidant (an embodiment in which the content of the oxidant is substantially 0% by mass on the basis of the total mass of the polishing liquid). The upper limit of the content of the oxidant may be 0.01% by mass or less, 0.001% by mass or less, or 0.0001% by mass or less, on the basis of the total mass of the polishing liquid. The polishing liquid of the present embodiment may be an embodiment not containing at least one compound "a" selected from the group consisting of: a compound, which is a branched molecule having a molecular structure branched into three or more, has a nitrogen atom or a carbon atom as a central atom, and contains three or more ethylene oxide groups in one molecule, and a salt thereof; and a compound, which contains one or more functional groups that ionize in a aqueous solution and three or more ethylene oxide groups, and a salt thereof. The upper limit of the content of the compound "a" may be 0.00001% by mass or less (0.1 ppm or less) or less than 0.00001% by mass, on the basis of the total mass of the polishing liquid.

(Liquid Medium)

The polishing liquid of the present embodiment may contain a liquid medium. The liquid medium is not particularly limited, and may be water such as deionized water or ultrapure water. The content of the liquid medium may correspond to the remaining of the polishing liquid from which the contents of other constituent components are removed, and is not particularly limited.

(pH)

The lower limit of pH of the polishing liquid of the present embodiment may be 2.0 or more, 2.2 or more, 2.5 or more, 3.0 or more, 3.1 or more, 3.3 or more, 3.5 or more, 3.8 or more, or 4.0 or more, from the viewpoint of easily obtaining excellent dispersion stability of the abrasive grains, the viewpoint of easily suppressing excessive dishing, and the viewpoint of easily suppressing excessive polishing of the stopper at the time of over-polishing. The upper limit of pH may be 6.0 or less, 5.5 or less, 5.0 or less, less than 5.0, 4.5 or less, 4.2 or less, or 4.0 or less, from the viewpoint of easily obtaining excellent dispersion stability of the abrasive grains, the viewpoint of easily suppressing excessive dishing, and the viewpoint of easily suppressing excessive polishing of the stopper at the time of over-polishing. From these viewpoints, the pH of the polishing liquid may be 2.0 to 6.0 or 2.5 to 4.5. The pH of the polishing liquid is defined as the pH at a liquid temperature of 25° C.

The pH of the polishing liquid can be measured using a pH meter (for example, Model PH81 (trade name) manufactured by Yokogawa Electronic Corp.). For example, after 2-point calibration using standard buffer solution (phthalate pH buffer solution, pH: 4.21 (25° C.) and neutral phosphate pH buffer solution, pH: 6.86 (25° C.)), the electrode is placed in the polishing liquid, and a value upon stabilization after an elapse of 2 minutes or longer at 25° C. is measured.

(Storing Method)

The polishing liquid of the present embodiment may be stored as a one-pack type polishing liquid containing at least the abrasive grains, the hydroxy acid component, and the compound Z, or may be stored as a multi-pack type (for example, two-pack type) polishing liquid set containing constituent components of this polishing liquid divided into a slurry (first liquid) and an additive liquid (second liquid). The slurry contains, for example, at least abrasive grains. The additive liquid contains, for example, at least the hydroxy acid component and the compound Z. The hydroxy acid component, the compound Z, and an arbitrary additive may be contained in the additive liquid among the slurry and the additive liquid. The constituent components of the polishing liquid may also be stored as a polishing liquid set divided into three or more liquids.

In the polishing liquid set, the slurry and the additive liquid are mixed immediately before polishing or at the time of polishing to prepare the polishing liquid. The one-pack type polishing liquid may be stored as a stock solution for a polishing liquid with a reduced liquid medium content and used by dilution with a liquid medium at the time of polishing. The polishing liquid set may be stored as a stock solution for a slurry and a stock solution for an additive liquid with reduced liquid medium contents, and used by dilution with a liquid medium at the time of polishing.

<Polishing Method>

A polishing method of the present embodiment may include a polishing step of polishing a surface to be polished by using the polishing liquid of the present embodiment (one-pack type polishing liquid) or a polishing liquid obtained by mixing the slurry and the additive liquid of the polishing liquid set of the present embodiment. The surface to be polished may contain silicon oxide, and may contain silicon oxide and silicon nitride.

The polishing method of the present embodiment may be a polishing method for a base substrate having an insulating material and silicon nitride, and may include, for example, a polishing step of selectively polishing the insulating material with respect to the silicon nitride by using the polishing liquid of the present embodiment (one-pack type polishing liquid) or a polishing liquid obtained by mixing the slurry and the additive liquid of the polishing liquid set of the present embodiment. The base substrate may have, for example, a member containing an insulating material and a member containing silicon nitride. The expression "selectively polishing a material A with respect to a material B" means that the polishing rate for the material A is higher than the polishing rate for the material B under the same conditions.

The polishing method of the present embodiment may be a polishing method for a base substrate having a first member containing silicon nitride and a second member containing an insulating material and also disposed on the first member. The polishing step may include a step of polishing the second member until the first member is exposed, by using the polishing liquid of the present embodiment (one-pack type polishing liquid) or a polishing liquid obtained by mixing the slurry and the additive liquid of the polishing liquid set of the present embodiment. The polishing step may include a step of polishing the first member and the second member, by using the polishing liquid of the present embodiment (one-pack type polishing liquid) or a polishing liquid obtained by mixing the slurry and the additive liquid of the polishing liquid set of the present embodiment, after the first member is exposed.

In the polishing step, for example, in a state where a material to be polished of the base substrate that has the material to be polished is pressed against a polishing pad (polishing cloth) of a polishing platen, the surface to be polished of the material to be polished can be polished by supplying the polishing liquid between the material to be polished and the polishing pad, and moving the base substrate and the polishing platen relative to each other. In the polishing step, for example, at least a part of a material to be polished can be removed by polishing.

As the base substrate that is to be polished, a substrate to be polished or the like is exemplified. As the substrate to be polished, for example, a base substrate in which a material to be polished is formed on a substrate for semiconductor element production (for example, a semiconductor substrate in which an STI pattern, a gate pattern, a wiring pattern, or the like is formed) is exemplified. Examples of a material to be polished include an insulating material (excluding a material corresponding to a stopper material) such as silicon oxide; and a stopper material such as silicon nitride. A material to be polished may be a single material or may be a plurality of materials. In the case where a plurality of materials are exposed on a surface to be polished, they can be considered as a material to be polished. A material to be polished may be in the form of a film (film to be polished) or may be a silicon oxide film, a silicon nitride film, or the like.

By polishing a material to be polished (for example, an insulating material such as silicon oxide) formed on such a substrate with the polishing liquid to remove an excess part, it is possible to eliminate irregularities on the surface of a material to be polished and to produce a smooth surface over the entire surface of the polished material. The polishing liquid of the present embodiment may be used for polishing a surface to be polished containing silicon oxide, and may be used for polishing a surface to be polished containing silicon oxide and silicon nitride.

In the present embodiment, it is possible to polish an insulating material of a base substrate having an insulating material containing silicon oxide on at least the surface, a stopper (polishing stop layer) disposed as an underlayer of the insulating material, and a substrate (semiconductor substrate or the like) disposed under the stopper. The stopper material constituting the stopper may be silicon nitride as a material having a polishing rate lower than that of the insulating material.

Examples of a method for forming a material to be polished by the polishing liquid of the present embodiment include a CVD method such as a low-pressure CVD method, a normal-pressure CVD method, and a plasma CVD method; and a rotation application method in which a liquid raw material is applied to a rotating substrate.

Hereinafter, the polishing method of the present embodiment will be described by taking a polishing method for a base substrate (for example, a base substrate having an insulating material formed on a semiconductor substrate) as an example. In the polishing method of the present embodiment, as a polishing apparatus, it is possible to use a common polishing apparatus which has a holder capable of holding a base substrate having a surface to be polished and a polishing platen to which a polishing pad can be attached. A motor or the like in which the number of rotations can be changed is attached to each of the holder and the polishing platen. As the polishing apparatus, for example, a polishing apparatus: MIRRA manufactured by Applied Materials, Inc. can be used.

As the polishing pad, common unwoven cloth, a foamed body, an unfoamed body, or the like can be used. Examples of the material of the polishing pad include a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, and an epoxy resin. From the viewpoint of easily obtaining an excellent polishing rate and excellent flatness, the material for the polishing pad may be at least one selected from the group consisting of a foamed polyurethane and a non-foamed polyurethane. The polishing pad may be subjected to groove processing by which the polishing liquid accumulates thereon. Polishing conditions are not limited, but the upper limit of the rotation speed of a polishing platen may be 200 rpm (rpm=min$^{-1}$) or less such that the base substrate is not let out, and the upper limit of the polishing pressure (processing load) to be applied to the base substrate may be 15 psi (103 kPa) or less from the viewpoint of easily and sufficiently suppressing the generation of polishing scratches. The polishing liquid may be continuously supplied to the polishing pad with a pump or the like during polishing. The amount supplied for this is not limited, but the surface of the polishing pad may be always covered with the polishing liquid.

The base substrate after the completion of polishing may be thoroughly washed in running water to remove the particles adhering to the base substrate. For the washing, dilute hydrofluoric acid or ammonia water may be used concurrently in addition to pure water, and a brush may be used to increase the washing efficiency. After washing, the water droplets adhering to the base substrate may be removed off using a spin dryer or the like, and then the base substrate may be dried.

The present embodiment can also be used in polishing of a pre-metal insulating material. Examples of the pre-metal insulating material include silicon oxide, phosphorus-silicate glass, boron-phosphorus-silicate glass, silicon oxyfluoride, and fluorinated amorphous carbon.

The present embodiment can also be applied to materials other than the insulating material such as silicon oxide. Examples of such a material include high permittivity materials such as Hf-based, Ti-based, and Ta-based oxides; semiconductor materials such as silicon, amorphous silicon, SiC, SiGe, Ge, GaN, GaP, GaAs, and organic semiconductors; phase-change materials such as GeSbTe; inorganic conductive materials such as ITO; and polymer resin materials such as polyimide-based, polybenzooxazole-based, acrylic, epoxy-based, and phenol-based materials.

The present embodiment can also be applied not only to film-like materials to be polished, but also to various types of substrates made of glass, silicon, SiC, SiGe, Ge, GaN, GaP, GaAs, sapphire, plastics, or the like.

The present embodiment can be used not only for production of semiconductor elements, but also for production of image display devices such as TFTs and organic ELs; optical parts such as photomasks, lenses, prisms, optical fibers, and single crystal scintillators; optical elements such as optical switching elements and optical waveguides; light-emitting elements such as solid lasers and blue laser LEDs; and magnetic storage devices such as a magnetic disks and magnetic heads; and the like.

A method of producing a component of the present embodiment includes an individually dividing step of dividing a base substrate polished by the polishing method of the present embodiment. The individually dividing step may be, for example, a step of dicing a wafer (for example, a semiconductor wafer) polished by the polishing method of the present embodiment to obtain chips (for example, semiconductor chips). The method of producing a component of the present embodiment may include a step of polishing a base substrate by the polishing method of the present embodiment before the individually dividing step. A component of the present embodiment may be, for example, a chip (for example, a semiconductor chip). The component of the present embodiment is a component obtained by the method of producing a component of the present embodiment. An electronic device of the present embodiment includes the component of the present embodiment.

EXAMPLES

Hereinafter, the present disclosure will be specifically described by means of Examples. However, the present disclosure is not limited to the following Examples.

<Preparation of Slurry Containing Abrasive Grains>
(Slurry A)
[Preparation of Cerium Oxide Slurry]

Cerium oxide particles and trade name: ammonium dihydrogen phosphate (molecular weight: 97.99) manufactured by Wako Pure Chemical Industries, Ltd. were mixed to prepare a cerium oxide slurry (pH: 7) containing 5.0% by mass (solid content) of cerium oxide particles (first particles). The blending amount of the ammonium dihydrogen phosphate was adjusted to 1% by mass on the basis of the total amount of the cerium oxide particles.

An adequate amount of the cerium oxide slurry was charged into trade name: MICROTRAC MT3300EXII manufactured by MicrotracBEL Corp., and the average particle diameter of the cerium oxide particles was measured. The displayed average particle diameter value was obtained as the average particle diameter (average secondary particle diameter). The average particle diameter of the cerium oxide particles in the cerium oxide slurry was 145 nm.

An adequate amount of the cerium oxide slurry was charged into trade name: DelsaNano C manufactured by Beckman Coulter, Inc., and measurement was performed twice at 25° C. The average value of the displayed zeta potentials was obtained as the zeta potential. The zeta potential of the cerium oxide particles in the cerium oxide slurry was -55 mV.

[Preparation of Cerium Hydroxide Slurry]
{Synthesis of Cerium Hydroxide}

480 g of an aqueous 50% by mass $Ce(NH_4)_2(NO_3)_6$ solution (trade name: CAN50 liquid manufactured by Nihon Kagaku Sangyo Co., Ltd.) was mixed with 7450 g of pure water to obtain a solution. Next, while stirring this solution, 750 g of an aqueous imidazole solution (10% by mass aqueous solution, 1.47 mol/L) was added dropwise at a mixing rate of 5 mL/min, and thereby a precipitate containing cerium hydroxide was obtained. The cerium hydroxide was synthesized at a temperature of 20° C. and a stirring speed of 500 $min^{-1}$. The stirring was carried out using a 3-blade pitch paddle with a total blade section length of 5 cm.

The aforementioned precipitate (precipitate containing cerium hydroxide) was subjected to centrifugal separation (4000 $min^{-1}$, for 5 minutes), and then subjected to solid-liquid separation with removal of a liquid phase by decantation. 10 g of particles obtained by solid-liquid separation and 990 g of water were mixed, and then the particles were dispersed in the water by using an ultrasonic cleaner to prepare a cerium hydroxide slurry (content of particles: 1.0% by mass) containing cerium hydroxide particles (second particles).

{Measurement of Average Particle Diameter}

When the average particle diameter (average secondary particle diameter) of the cerium hydroxide particles in the cerium hydroxide slurry was measured according to the following procedures using trade name: N5 manufactured by Beckman Coulter, Inc., a value of 10 nm was obtained. First, about 1 mL of a measuring sample (cerium hydroxide slurry, aqueous dispersion) containing 1.0% by mass of cerium hydroxide particles was introduced in a 1-cm square cell, and then the cell was set in the N5. The refractive index and the viscosity were set to 1.333 and 0.887 mPa·s as the measuring sample information of N5 software, respectively, measurement was then performed at 25° C., and the value displayed as Unimodal Size Mean was read off.

{Measurement of Zeta Potential}

An adequate amount of the cerium hydroxide slurry was charged into trade name: DelsaNano C manufactured by Beckman Coulter, Inc. and then measurement was performed twice at 25° C. The average value of the displayed zeta potentials was obtained as the zeta potential. The zeta potential of the cerium hydroxide particles in the cerium hydroxide slurry was +50 mV.

{Structural Analysis of Cerium Hydroxide Particles}

An adequate amount of the cerium hydroxide slurry was taken and vacuum dried to isolate the cerium hydroxide particles, and then sufficiently washed with pure water to obtain a sample. When the obtained sample was measured by FT-IR ATR method, a peak based on nitrate ion ($NO_3^-$) was observed in addition to a peak based on hydroxide ion ($OH^-$). Furthermore, when the same sample was measured by XPS (N-XPS) for nitrogen, a peak based on nitrate ion was observed while no peak based on $NH_4^+$ was observed. These results confirmed that the cerium hydroxide particles at least partially contained particles having nitrate ion bonded to a cerium element. Furthermore, since particles having hydroxide ion bonded to a cerium element were at least partially contained in the cerium hydroxide particles, it was confirmed that the cerium hydroxide particles contained cerium hydroxide. These results confirmed that the cerium hydroxide contained a hydroxide ion bonded to a cerium element.

[Preparation of Slurry A]

While stirring at a rotation speed of 300 rpm using a stirring blade of two blades, 20 g of the aforementioned cerium hydroxide slurry and 1940 g of deionized water were mixed to obtain a mixed liquid. Subsequently, after 40 g of the aforementioned cerium oxide slurry was mixed while stirring this mixed liquid, stirring was performed while irradiating with ultrasonic waves by using an ultrasonic cleaner (device name: US-105) manufactured by SND Co., Ltd., thereby preparing a slurry A containing composite particles which include cerium oxide particles and cerium hydroxide particles contact with the cerium oxide particles.

(Slurry B)

Cerium oxide particles and acetic acid (molecular weight: 60.05) were mixed to prepare a slurry B (pH: 4) containing 5.0% by mass (solid content) of the cerium oxide particles. The blending amount of the acetic acid was adjusted to 1% by mass on the basis of the total amount of the cerium oxide particles.

An adequate amount of the slurry B was charged into trade name: MICROTRAC MT3300EXII manufactured by MicrotracBEL Corp., and the average particle diameter of the cerium oxide particles was measured. The displayed average particle diameter value was obtained as the average particle diameter (average secondary particle diameter). The average particle diameter of the cerium oxide particles in the slurry B was 140 nm.

<Preparation of Polishing Liquid for CMP>

Example 1

A polishing liquid for CMP (pH: 4.0) containing 0.10% by mass of abrasive grains, 0.40% by mass of a hydroxy acid component, 0.05% by mass of polyoxyethylene stearyl amine, and 0.09% by mass of alanine on the basis of the total mass of the polishing liquid was obtained by mixing the aforementioned slurry A, 2,2-bis(hydroxymethyl) butyric acid (the hydroxy acid component), polyoxyethylene stearyl amine (manufactured by NOF CORPORATION, trade name: Nymeen S-220, the number of carbon atoms "a" of the hydrocarbon group: 18, the total number of oxyalkylene groups: 20, HLB value: 15.4), alanine (pH adjusting agent, pI=6.00), and deionized water. As the abrasive grains, the polishing liquid for CMP contained composite particles including cerium oxide particles and cerium hydroxide particles that were in contact with the cerium oxide particles, and the mass ratio between the cerium oxide particles and the cerium hydroxide particles was 10:1 (cerium oxide: cerium hydroxide). As the abrasive grains, the polishing liquid for CMP contained cerium hydroxide particles (free particles) that were not in contact with the cerium oxide particles, in addition to the aforementioned composite particles.

Example 2

A polishing liquid for CMP (pH: 4.0) containing composite particles and free particles was prepared in the same manner as in Example 1, except that polyoxyethylene stearyl amine was changed to polyoxyethylene polycyclic phenyl ether (manufactured by NIPPON NYUKAZAI CO., LTD., trade name: N-714, the number of carbon atoms "a" of the hydrocarbon group: 30, the total number of oxyalkylene groups: 14, HLB value: 15.0).

Example 3

A polishing liquid for CMP (pH: 4.0) containing composite particles and free particles was prepared in the same manner as in Example 1, except that polyoxyethylene stearyl amine was changed to polyoxyethylene polycyclic phenyl ether (manufactured by NIPPON NYUKAZAI CO., LTD., trade name: N-723, the number of carbon atoms "a" of the hydrocarbon group: 30, the total number of oxyalkylene groups: 23, HLB value: 16.6).

Example 4

A polishing liquid for CMP (pH: 4.0) containing composite particles and free particles was prepared in the same manner as in Example 1, except that polyoxyethylene stearyl amine was changed to polyoxyethylene polycyclic phenyl ether (manufactured by NIPPON NYUKAZAI CO., LTD., trade name: N-780, the number of carbon atoms "a" of the hydrocarbon group: 30, the total number of oxyalkylene groups: 80, HLB value: 18.9).

Example 5

A polishing liquid for CMP (pH: 4.0) containing composite particles and free particles was prepared in the same manner as in Example 1, except that 2,2-bis(hydroxymethyl) butyric acid was changed to tricine and polyoxyethylene stearyl amine was changed to polyoxyethylene polycyclic phenyl ether (manufactured by NIPPON NYUKAZAI CO., LTD., trade name: N-780).

Example 6

A polishing liquid for CMP (pH: 4.0) containing composite particles and free particles was prepared in the same manner as in Example 1, except that 2,2-bis(hydroxymethyl) butyric acid was changed to lactic acid and polyoxyethylene stearyl amine was changed to polyoxyethylene polycyclic phenyl ether (manufactured by NIPPON NYUKAZAI CO., LTD., trade name: N-780).

Example 7

A polishing liquid for CMP (content of abrasive grains (cerium oxide particles): 0.10% by mass, pH: 4.0) was prepared in the same manner as in Example 1, except that the slurry A was changed to the slurry B and polyoxyethylene stearyl amine was changed to polyoxyethylene polycyclic phenyl ether (manufactured by NIPPON NYUKAZAI CO., LTD., trade name: N-780).

Comparative Example 1

A polishing liquid for CMP (pH: 4.0) was prepared in the same manner as in Example 1, except that polyoxyethylene stearyl amine was changed to polyoxyethylene monophenyl ether (manufactured by TAKEMOTO OIL & FAT Co., Ltd., trade name: Pionin 6140, the number of carbon atoms "a" of the hydrocarbon group: 6, the total number of oxyalkylene groups: 10, HLB value: 16.4).

Comparative Example 2

A polishing liquid for CMP (pH: 4.0) was prepared in the same manner as in Example 1, except that polyoxyethylene stearyl amine was changed to polyoxyethylene cumyl phenyl ether (manufactured by NIPPON NYUKAZAI CO., LTD., trade name: CMP-11, the number of carbon atoms "a" of the hydrocarbon group: 15, the total number of oxyalkylene groups: 11, HLB value: 13.6).

Comparative Example 3

A polishing liquid for CMP (pH: 4.0) was prepared in the same manner as in Example 1, except that polyoxyethylene stearyl amine was changed to polyoxyethylene laurylamine (manufactured by NOF CORPORATION, trade name: Nymeen L-207, the number of carbon atoms "a" of the hydrocarbon group: 12, the total number of oxyalkylene groups: 7, HLB value: 12.5).

Comparative Example 4

A polishing liquid for CMP (pH: 4.0) was prepared in the same manner as in Example 1, except that polyoxyethylene stearyl amine was changed to polyoxyethylene alkyl ether (manufactured by NIPPON NYUKAZAI CO., LTD., trade name: N-2308, the number of carbon atoms "a" of the hydrocarbon group: 12, the total number of oxyalkylene groups: 8, HLB value: 13.2).

Comparative Example 5

A polishing liquid for CMP (pH: 4.0) was prepared in the same manner as in Example 1, except that polyoxyethylene stearyl amine was changed to polyoxyethylene trimethylolpropane ether (manufactured by NIPPON NYUKAZAI CO., LTD., trade name: TMP-60, the number of carbon atoms "a" of the hydrocarbon group: 0, the total number of oxyalkylene groups: 24, HLB value: 15.2).

Comparative Example 6

A polishing liquid for CMP (pH: 4.0) was prepared in the same manner as in Example 1, except that 2,2-bis(hydroxymethyl) butyric acid was not added and the blending amount of deionized water was increased.

<Measurement of Zeta Potential>

An adequate amount of the polishing liquid for CMP was charged into trade name: DelsaNano C manufactured by Beckman Coulter, Inc. and then measurement was performed twice at 25° C. The average value of the displayed zeta potentials was obtained as the zeta potential. The zeta potential of the abrasive grains in the polishing liquid for CMP in all of Examples and Comparative Examples was positive.

<CMP Evaluation>

The substrate to be polished was polished using the aforementioned polishing liquid for CMP under the following polishing conditions.

Polishing apparatus: MIRRA-3400 (manufactured by Applied Materials, Inc.)

Flow rate of polishing liquid for CMP: 200 mL/min

Substrate to be polished: Blanket wafer and pattern wafer described below

Polishing pad: Foamed polyurethane resin having closed pores (Model No. IC1010 manufactured by ROHM AND HAAS ELECTRONIC MATERIALS CMP INC.)

Polishing pressure: 3.0 psi

Number of rotations of substrate to be polished and polishing platen: Substrate to be polished/polishing platen=90/87 rpm Polishing time:

(Blanket wafer) 1 min (Pattern wafer) A wafer described below in which polishing was performed until the silicon nitride film was exposed was additionally polished (over-polished) using the aforementioned polishing liquid for CMP by the polished amounts of 20 nm and 40 nm. The remaining step height (dishing) and the polished amount of the silicon nitride film at this time was checked.

Washing of wafer: After a CMP treatment, washing was performed with water while applying an ultrasonic wave, and then drying was performed with a spin dryer.

[Blanket Wafer]

As a blanket wafer, a substrate to be polished having a silicon oxide film having a thickness of 2 μm, which had been formed by a plasma CVD method, on a silicon substrate was used.

[Pattern wafer]

As a pattern wafer with a simulated pattern formed, 864 wafer (trade name, diameter: 200 mm) manufactured by SEMATECH was used. This pattern wafer was a wafer obtained by stacking a silicon nitride film as a stopper (stopper film) on a silicon substrate, then forming a trench in an exposure step, and stacking a silicon oxide film ($SiO_2$ film) as an insulating film on the silicon substrate and the silicon nitride film to fill the stopper and the trench. The silicon oxide film was formed by a HDP (High Density Plasma) method.

As the pattern wafer, a wafer having a part with Line (convex portion) & Space (concave portion) of 50 μm pitch and a convex pattern density of 50% was used. The Line & Space is a simulated pattern, and is a pattern in which an Active portion masked by the stopper film as the convex portion and a Trench portion with a groove formed as the concave portion are alternately arranged. For example, the phrase "Line & Space of 50 μm pitch" means that the total of the widths of a line portion and a space portion is 50 μm. Furthermore, for example, the phrase "Line & Space of 50 μm pitch and a convex pattern density of 50%" means a pattern in which a convex portion having a convex width of 25 μm and a concave portion having a concave width of 25 μm are alternately arranged.

In the polishing evaluation of the pattern wafer, a wafer in which the remaining step height becomes about 30 nm by polishing the aforementioned wafer by using a known polishing liquid for CMP having self-stopping property (property of reducing the polishing rate in accordance with a decrease in the remaining step height in the simulated pattern) was used. Specifically, a wafer, which was polished until the silicon nitride film at the convex portion in 50 μm pitch and 50% pattern density was exposed using a polishing liquid in which HS-8005-D4 (trade name) manufactured by Hitachi Chemical Co., Ltd., HS-7303GP (trade name) manufactured by Hitachi Chemical Co., Ltd., and water were blended in a ratio of 1:1.2:7.8, was used.

[Evaluation of Blanket Wafer (Polishing Rate)]

Regarding the substrate to be polished which had been polished and washed under the aforementioned condition, the polishing rate for the film to be polished (silicon oxide film) was obtained by the following formula. Incidentally, the film thickness difference of each film to be polished before and after polishing was determined using a light interference type film thickness measuring apparatus (manufactured by Filmetrics Japan, Inc., trade name: F80). The measurement results are shown in Tables 1 and 2.

Polishing rate ($RR$)=(Film thickness difference [nm] of each film to be polished before and after polishing)/(Polishing time [min])

[Evaluation of Pattern Wafer]

The remaining film thicknesses of the silicon nitride film of the convex portion (the convex portion in 50 μm pitch and 50% density pattern) and the remaining film thicknesses of the silicon oxide film of the concave portion of the pattern wafer which had been polished and washed under the aforementioned condition were measured to obtain a remaining step height by using the following formula. In the formula, "350 nm+Remaining film thicknesses [nm] of silicon nitride film" represents a film thickness of the convex portion. A case where the remaining step height is 12 nm or less was determined as good. Furthermore, the polished amount of the silicon nitride film was obtained using a difference between the initial thickness of the silicon nitride film and the thickness of the silicon nitride film after polishing (remaining film thicknesses) by the following formula. The film thicknesses of each film to be polished before and after polishing were determined using a light interference type film thickness measuring apparatus (trade name: Nanospec AFT-5100 manufactured by Nanometrics Incorporated). The measurement results are shown in Tables 1 and 2.

Remaining step height=(350 nm+Remaining film thicknesses [nm] of silicon nitride film)−(Remaining film thicknesses [nm] of silicon oxide film of concave portion)

Polished amount of silicon nitride film=1500 nm−Remaining film thicknesses [nm] of silicon nitride film of convex portion

TABLE 1

|  |  | Example 1 | Example 2 | Example 3 | Example 4 | Example 5 | Example 6 | Example 7 |
|---|---|---|---|---|---|---|---|---|
| Abrasive grains | Type | Slurry A | | | | | | Slurry B |
|  | Content [mass %] | 0.10 | | | | | | 0.10 |
| Hydroxy acid component | Type | 2,2-Bis(hydroxymethyl)butyric acid | | | | Tricine | Lactic acid | 2,2-Bis(hydroxymethyl)butyric acid |
|  | Number of carboxy groups | 1 | | | | 1 | 1 | 1 |
|  | Number of hydroxyl groups | 2 | | | | 3 | 1 | 2 |
|  | Content [mass %] | 0.40 | | | | 0.40 | 0.40 | 0.40 |
| Surfactant | Type | Polyoxyethylene stearyl amine | Polyoxyethylene polycyclic phenyl ether | | | | | |
|  | Number of carbon atoms of hydrocarbon group: a | 18 | 30 | 30 | | | 30 | |
|  | Total number of oxyalkylene groups: b | 20 | 14 | 23 | | | 80 | |
|  | HLB value: c | 15.4 | 15.0 | 16.6 | | | 18.9 | |
|  | Z value | 42 | 84 | 125 | | | 381 | |
|  | Content [mass %] | 0.05 | | | | 0.05 | | |
| Evaluation Blanket wafer | Polishing rate [nm/min] | 120 | 328 | 296 | 238 | 282 | 72 | 351 |
| Pattern wafer | Remaining step height [nm] | 8 | 7 | 7 | 3 | 5 | 5 | 3 |
|  | Silicon nitride film polished amount [nm] | 3 | 2 | 3 | 6 | 17 | 8 | 6 |

TABLE 2

|  |  | Comparative Example 1 | Comparative Example 2 | Comparative Example 3 | Comparative Example 4 | Comparative Example 5 | Comparative Example 6 |
|---|---|---|---|---|---|---|---|
| Abrasive grains | Type | Slurry A | | | | | |
|  | Content [mass %] | 0.10 | | | | | |
| Hydroxy acid component | Type | 2,2-Bis(hydroxymethyl)butyric acid | | | | | — |
|  | Number of carboxy groups | 1 | | | | | |
|  | Number of hydroxyl groups | 2 | | | | | |
|  | Content [mass %] | 0.40 | | | | | |
| Surfactant | Type | Polyoxyethylene monophenyl ether | Polyoxyethylene cumyl phenyl ether | Polyoxyethylene laurylamine | Polyoxyethylene alkyl ether | Polyoxyethylene trimethylolpropane ether | Polyoxyethylene stearyl amine |
|  | Number of carbon atoms of hydrocarbon group: a | 6 | 15 | 12 | 12 | 0 | 18 |
|  | Total number of oxyalkylene groups: b | 10 | 11 | 7 | 8 | 24 | 20 |
|  | HLB value: c | 16.4 | 13.6 | 12.5 | 13.2 | 15.2 | 14.5 |
|  | Z value | 2 | 18 | 8 | 9 | 0 | 45 |
|  | Content [mass %] | 0.05 | 0.05 | 0.05 | 0.05 | 0.05 | 0.05 |
| Evaluation Blanket wafer | Polishing rate [nm/min] | 368 | 374 | 384 | 18 | 292 | 111 |
| Pattern wafer | Remaining step height [nm] | 17 | 15 | 16 | 14 | 18 | 26 |
|  | Silicon nitride film polished amount [nm] | 3 | 3 | 4 | 3 | 4 | 28 |

The invention claimed is:

1. A polishing liquid comprising: abrasive grains; at least one hydroxy acid component selected from the group consisting of a hydroxy acid and a salt thereof; and a compound Z, wherein
the abrasive grains contain a cerium oxide,
a content of the cerium oxide is more than 50% by mass on the basis of the whole abrasive grains contained in the polishing liquid,
the compound Z has a hydrocarbon group which may be substituted and a polyoxyalkylene group, and
a Z value represented by General Formula (1) below is 20 or more:

$$Z = 0.1 \times a^2 \times b/c \quad (1)$$

[in Formula (1), "a" represents the number of carbon atoms of the hydrocarbon group, "b" represents the total number of oxyalkylene groups in the compound Z, and "c" represents an HLB value of the compound Z].

2. The polishing liquid according to claim 1, wherein a zeta potential of the abrasive grains is positive.

3. The polishing liquid according to claim 1, wherein the abrasive grains further contain cerium hydroxide.

4. The polishing liquid according to claim 1, wherein the total number of a carboxy group and a carboxylate group in the hydroxy acid component is 1.

5. The polishing liquid according to claim 1, wherein the number of a hydroxyl group in the hydroxy acid component is 1 or 2.

6. The polishing liquid according to claim 1, wherein the number of a hydroxyl group in the hydroxy acid component is 2 or more.

7. The polishing liquid according to claim 1, wherein the HLB value of the compound Z is 8.0 or more.

8. The polishing liquid according to claim 1, wherein the compound Z contains a compound represented by General Formula (z1) below:

[Chemical Formula 1]

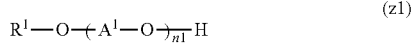
(z1)

[in Formula (z1), $A^1$ represents an alkylene group, $R^1$ represents the hydrocarbon group, and n1 represents an integer of 2 or more].

9. The polishing liquid according to claim 8, wherein the hydrocarbon group of the compound represented by General Formula (z1) is an aryl group having a plurality of aromatic rings.

10. The polishing liquid according to claim 1, wherein the compound Z contains a compound having a nitrogen atom to which the hydrocarbon group and the polyoxyalkylene group are bonded.

11. The polishing liquid according to claim 1, wherein the compound Z contains a compound represented by General Formula (z2) below:

[Chemical Formula 2]

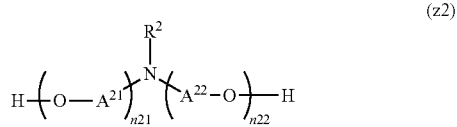
(z2)

[in Formula (z2), $A^{21}$ and $A^{22}$ each independently represent an alkylene group, $R^2$ represents the hydrocarbon group, and n21 and n22 each independently represent an integer of 2 or more].

12. The polishing liquid according to claim 11, wherein the hydrocarbon group of the compound represented by General Formula (z2) is an alkyl group.

13. The polishing liquid according to claim 1, wherein the HLB value "c" of the compound Z is 14.0 or more.

14. The polishing liquid according to claim 1, wherein the number of carbon atoms "a" of the hydrocarbon group is 18 or more.

15. A polishing liquid set comprising constituent components of the polishing liquid according to claim 1 separately stored as a first liquid and a second liquid, wherein
the first liquid contains the abrasive grains, and the second liquid contains the hydroxy acid component and the compound Z.

16. A polishing method comprising a polishing step of polishing a surface to be polished by using a polishing liquid obtained by mixing the first liquid and the second liquid of the polishing liquid set according to claim 15.

17. A polishing method comprising a polishing step of polishing a surface to be polished by using the polishing liquid according to claim 1.

18. The polishing method according to claim 17, wherein the surface to be polished contains silicon oxide.

19. The polishing method according to claim 18, wherein the surface to be polished further contains silicon nitride.

20. A polishing liquid comprising: abrasive grains; at least one hydroxy acid component selected from the group consisting of a hydroxy acid and a salt thereof; and a compound Z, wherein
a content of the compound Z is 1 to 100 parts by mass with respect to 100 parts by mass of the hydroxy acid component,
the compound Z has a hydrocarbon group which may be substituted and a polyoxyalkylene group, and
a Z value represented by General Formula (1) below is 20 or more:

$$Z=0.1 \times a^2 \times b/c \qquad (1)$$

[in Formula (1), "a" represents the number of carbon atoms of the hydrocarbon group, "b" represents the total number of oxyalkylene groups in the compound Z, and "c" represents an HLB value of the compound Z].

21. A polishing liquid comprising: abrasive grains; at least one hydroxy acid component selected from the group consisting of a hydroxy acid and a salt thereof; and a compound Z, wherein
the abrasive grains contain cerium hydroxide,
a zeta potential of the abrasive grains is positive,
the compound Z has a hydrocarbon group which may be substituted and a polyoxyalkylene group, and
a Z value represented by General Formula (1) below is 20 or more:

$$Z=0.1 \times a^2 \times b/c. \qquad (1)$$

[in Formula (1), "a" represents the number of carbon atoms of the hydrocarbon group, "b" represents the total number of oxyalkylene groups in the compound Z, and "c" represents an HLB value of the compound Z].

* * * * *